(12) United States Patent
Chen et al.

(10) Patent No.: US 6,462,390 B1
(45) Date of Patent: Oct. 8, 2002

(54) MULTI-FILM CAPPING LAYER FOR A SALICIDE PROCESS

(75) Inventors: Ming-Shing Chen, Kaohsiung Hsien; Shu-Jen Chen, Hsinchu; Jy-Hwang Lin, Kaohsiung; Kuen-Syh Tseng, Pingtung, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/672,234

(22) Filed: Sep. 27, 2000

(30) Foreign Application Priority Data

Aug. 1, 2000 (TW) ........................................ 89115392 A

(51) Int. Cl.$^7$ ............................................ H01L 21/336
(52) U.S. Cl. ........................ 257/412; 257/413; 257/331; 257/360
(58) Field of Search ................................ 257/412, 413, 257/360, 331

(56) References Cited

U.S. PATENT DOCUMENTS

| | | | | |
|---|---|---|---|---|
| 5,945,719 A | * | 8/1999 | Tsuda | ........................... 257/413 |
| 6,114,736 A | * | 9/2000 | Balasubramanyam et al. | |
| 6,198,144 B1 | * | 3/2001 | Pan et al. | .................... 257/412 |

* cited by examiner

*Primary Examiner*—Fetsum Abraham

(57) ABSTRACT

A multi-film capping layer having a cobalt layer, a barrier layer, and a stuffing layer is disclosed, wherein the barrier layer isolates the cobalt layer from the stuffing layer. The multi-film capping layer is formed on a gate transistor and applicable to a self-aligned silicide (salicide) process, so that a sheet resistance of the salicide layer on conductive regions of the gate transistor is significantly reduced. The stuffing layer further prevents entry of oxygen or moisture to the salicide layer, thus no cobalt oxide is formed when RTP is performed. Without formation of the cobalt oxide, the salicide process is free from the bridging issue and the filament issue.

16 Claims, 2 Drawing Sheets

MULTI-FILM CAPPING LAYER FOR A SALICIDE PROCESS

CROSS-REFERENCE TO RELATED APPLICATION

This application claims the priority benefit of Taiwan application serial no. 89115392, filed Aug. 1, 2000.

BACKGROUND OF THE INVENTION

1. Field of Invention

The present invention relates to a multi-level capping layer applicable to a semiconductor process. More particularly, the present invention relates to a multi-film capping layer applicable to a self-aligned silicide (salicide) process.

2. Description of Related Art

Conventionally, a self-aligned silicide (salicide) process is usually performed to form a metal silicide layer, such as titanium silicide layer, on a source/drain region and gate polysilicon layer of a gate transistor, so as to reduce the resistance of the gate transistor. The metal silicide layer formed as such results an increased electrical conduction in the gate transistor, and thus an operation speed of a semiconductor device is improved.

However, as the size of the semiconductor device has gradually reduced according to the design rule, a sheet resistance of the metal silicide increases. This is known as a narrow line width effect. It was known that the sub-micron process of below 0.15 micron is possibly an ultimate limitation for using the titanium silicide layer. To follow a trend for an increased integration of the semiconductor device, another metal layer, such as cobalt (Co) layer which produce a lower sheet resistance regardless of size reduction of the device, is selected for forming the metal silicide layer.

FIG. 1A is a schematic, cross-sectional diagram illustrating a metal layer formed on a gate transistor without a capping layer. A semiconductor substrate 100 is provided having shallow trench isolations 102 (STI) formed therein. The STI 102 define an active region (not shown) for forming a gate transistor 104, which gate transistor 104 comprising a source/drain region 106, a gate oxide layer 108, a polysilicon layer 110, and a gate spacer 112, as shown in FIG. 1A. A metal layer, such as the Co layer 114 is formed to cover a profile including the gate transistor 104 and the surface of the substrate 100. This allows performing a self-aligned silicide (salicide) process including a rapid thermal process (RTP) which forms a cobalt silicide layer on the conductive regions of the gate transistor 104.

A chemical reaction between Co and Si occurs during the salicide process, and the reaction can simply be shown by the chemical equation below:

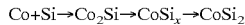

$$Co + Si \rightarrow Co_2Si \rightarrow CoSi_x \rightarrow CoSi_2$$

Since the $CoSi_x$ intermediate species is chemically very reactive in an ambient environment, a top portion of the Co layer 114 is consumed by the surrounding, while the rest of the Co layer 114 reacts with the silicon layer during the salicide process. This causes an increase in the sheet resistance ($R_{sh}$) of the cobalt silicide layer, and thus an increase in the overall resistance of the device. As a result, the device suffers a reduced operation speed.

One common solution to the problem stated above involves forming a titanium (Ti) layer 116 on the Co layer 114. FIG. 1B is a schematic, cross-sectional diagram illustrating a conventional capping layer formed on a gate transistor for a salicide process. The Ti layer 116 is formed directly on the Co layer 114 by sputtering so as to protect the Co layer 114 from being consumed by oxygen in the surroundings. Thus, this yields a more uniform Co layer 114 than the case without formation of the Ti layer 116. But, the Ti layer 116 itself produces other problems in terms of consumption of the Co layer 114. For example, a Co—Ti reaction occurs when the RTP is performed to consume the Co layer 114. This causes a thinning of the $CoSi_2$ layer that results an increase in the $R_{sh}$.

FIG. 1C is a schematic, cross-sectional diagram illustrating another conventional capping layer formed on a gate transistor for a salicide process, which capping layer is made of a titanium nitride (TiN). The TiN layer 118 does not consume cobalt and thus resolves the problem of Co thinning. However, a cobalt oxide is formed when a rapid thermal process is performed, since oxygen or moisture coming from a fabrication environment will diffuse into annular nanopipes surrounding columnar TiN grains and trapped therein. The cobalt oxide formed as such is hard to be removed in a cleaning step after the salicide is formed. If the cobalt oxide is not completely removed, a portion of the cobalt oxide can remain on the gate spacer. This produces a bridge issue or filament issue at which a trace of cobalt oxide undesirably connects up the gate polysilicon layer and the source/drain region, thus leading to a short circuiting.

SUMMARY OF THE INVENTION

The invention provides a multi-film capping layer which is applicable to a self-aligned silicide (salicide) process. The multi-film capping layer is a combination of different layers, each having a unique characteristics which works together to achieve a low resistance environment in a resultant device.

As embodied and broadly described herein, the invention provides a multi-film capping layer comprising of a cobalt (Co) layer, a barrier layer, and a stuffing layer. The multi-film capping layer is formed to cover a profile including a gate transistor which is constructed on a substrate. The Co layer is formed on substrate and covers the gate transistor so as to form a salicide layer on conductive regions of the gate transistor. The barrier layer is formed on the Co layer, while the stuffing layer is formed on the barrier layer, so that the barrier layer isolates the Co layer from the stuffing layer.

Accordingly, the multi-film capping layer has several advantages over the conventional capping layer for the salicide process. First of all, the sheet resistance ($R_{sh}$) of the salicide layer is significantly reduced, since the barrier layer formed above the Co layer solves the problem of Co thinning. The addition of the stuffing layer further prevents entry of oxygen or moisture to the salicide layer, thus no Co-oxide is formed when RTP is performed. Without formation of the Co-oxide, the invention is free from the bridging issue and the filament issue.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
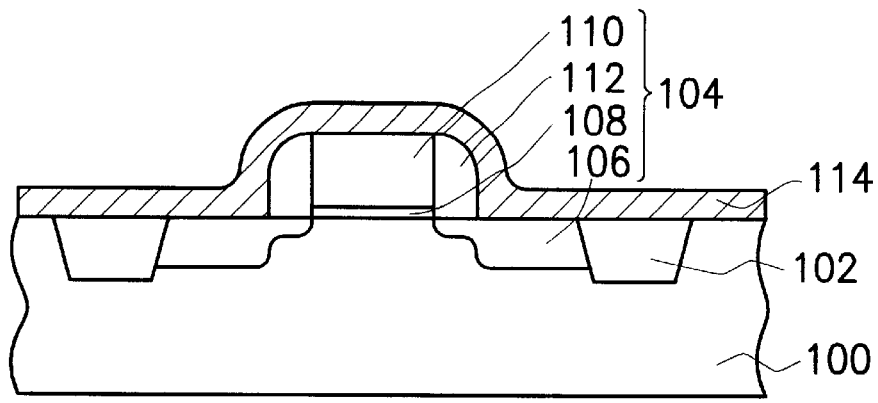
FIG. 1A is a schematic, cross-sectional diagram illustrating a metal layer formed on a gate transistor without a capping layer.
Figure 1B:
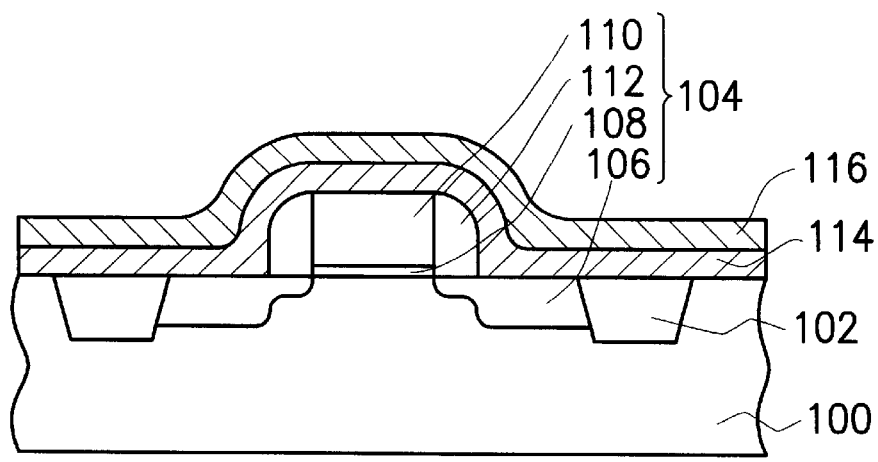
FIG. 1B is a schematic, cross-sectional diagram illustrating a conventional capping layer formed on a gate transistor for a salicide process.
Figure 1C:
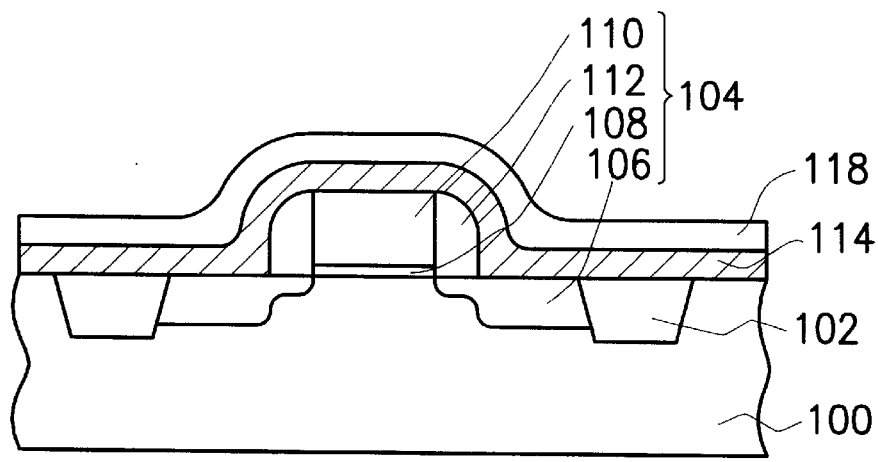
FIG. 1C is a schematic, cross-sectional diagram illustrating another conventional capping layer formed on a gate transistor for a salicide process.
Figure 2A:
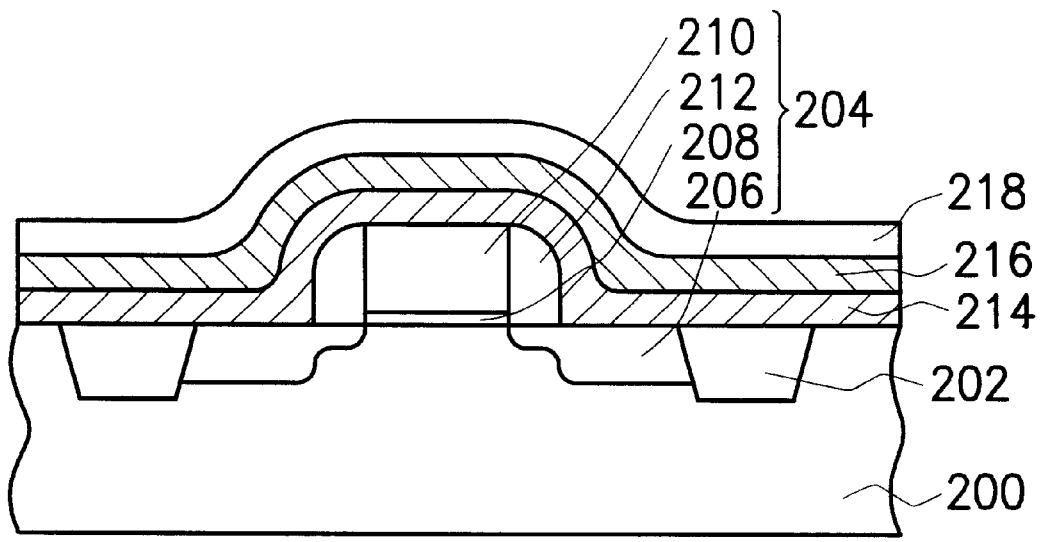
FIG. 2A is a schematic, cross-sectional diagram illustrating a multi-film capping layer applicable to a salicide process according to one preferred embodiment of the present invention.
Figure 2B:
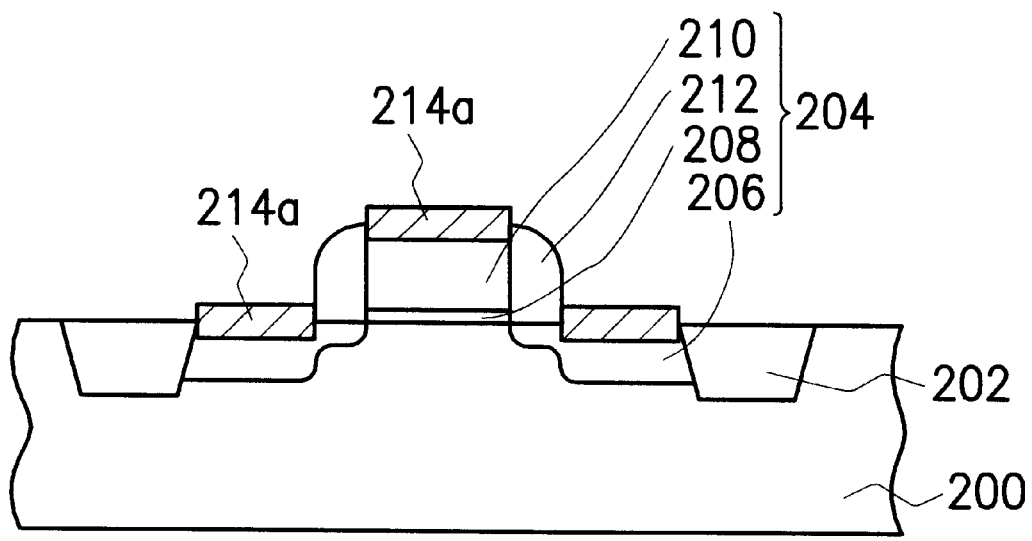
FIG. 2B is a resultant diagram illustrating a salicide layer formed from the multi-film capping layer in FIG. 2A.

FIG. 2A is a schematic, cross-sectional diagram illustrating a multi-film capping layer applicable to a salicide process according to one preferred embodiment of the present invention, while FIG. 2B is a resultant diagram illustrating a salicide layer formed from the multi-film capping layer in FIG. 2A.

Referring to FIG. 2A, a semiconductor substrate 200 is provided having shallow trench isolations 202 (STI) formed therein. The STI 102 define an active region (not shown) for forming a gate transistor 204, which gate transistor 204 comprising a source/drain region 206, a gate oxide layer 208, a polysilicon layer 210, and a gate spacer 212, as shown in FIG. 2A. A multi-film capping layer comprising a metal layer 214, a barrier layer 216, and a stuffing layer 218, is formed to conform with a profile including the gate transistor 204 and the substrate 200.

The metal layer 214, such as cobalt (Co) layer, is formed directly on the gate transistor 204, while the barrier layer 216 is formed directly on the metal layer 214. The barrier layer preferably includes a titanium nitride (TiN) layer, since the TiN layer serves to isolate the Co layer from oxygen in the surroundings. The TiN layer also does not consume the Co layer as does by the Ti layer, so TiN layer serves as a stable barrier for preventing oxygen diffusion to the growing salicide interface. A thickness of the buffer layer 216 is preferably about 50–300 angstroms. The stuffing layer 218 is then formed on the barrier layer 216, so that the stuffing layer 218 is isolated from the metal layer 214 by the barrier layer 216. The stuffing layer 218 can be made of any dense material less permeable to oxygen or moisture, but the stuffing layer 218 preferably includes a titanium (Ti) layer, tantalum nitride (TaN) or a silicon nitride layer. When the stuffing layer 218 is the titanium layer, it has a preferred thickness of about 50–300 angstroms. However, when the stuffing layer 218 is the silicon nitride layer, it has a preferred thickness of about 50–100 angstroms.

The multi-film capping layer can be removed after a rapid thermal process (RTP) is performed to form a salicide layer 214a on the source/drain region 206 and the gate polysilicon layer 204 which are conductive regions of the gate transistor 204. The salicide layer 214a which is formed on the resultant device is the same as the conventional salicide layer, while the salicide layer 214a according to the present invention has a reduced sheet resistance ($R_{sh}$) of about 4 ohms. Also, if the stuffing layer 218 is selected from the Ti layer, the stuffing layer 218 and the barrier layer 216 can be formed in situ, thus no additional step is required to complicate the process. Furthermore, another function of the barrier layer 216 is to stop the stuffing layer 218 from consuming the metal layer 214, when the Ti layer is selected for forming the stuffing layer 218.

Summarizing from above, it is understood that the multi-film capping layer has several advantages. First of all, the $R_{sh}$ of the salicide layer is significantly reduced, since the barrier layer formed above the Co layer solves the problem of Co thinning. The addition of the stuffing layer further prevents entry of oxygen or moisture to the salicide layer. Thus, no cobalt oxide is formed when RTP is performed. Without formation of the cobalt oxide, the invention is free from the bridging issue and the filament issue.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-film capping layer applicable to a salcide process, formed on a substrate having a gate transistor formed thereon, wherein the gate transistor further comprising a source/drain region formed in the substrate, a gate oxide layer on a part of the substrate, a doped polysilicon layer, and a spacer formed on a sidewall of the doped polysilicon layer, wherein the multi-film capping layer comprises:

a cobalt layer formed to conform with a profile of the substrate and the gate transistor;

a conformal titanium nitride layer formed directly on the cobalt layer; and a conformal stuffing layer formed directly on the conformal barrier layer, wherein the conformal barrier layer is in between the cobalt layer and the conformal stuffing layer.

2. The multi-film capping layer of claim 1, wherein the stuffing layer includes a titanium layer.

3. The multi-film capping layer of claim 2, wherein the titanium layer has a thickness of about 50–300 angstroms.

4. The multi-film capping layer of claim 1, wherein the stuffing layer includes a silicon nitride layer.

5. The multi-film capping layer of claim 4, wherein the silicon nitride layer has a thickness of about 50–100 angstroms.

6. The multi-film capping layer of claim 1, wherein the barrier layer and the stuffing layer are formed in situ.

7. A multi-level capping layer applicable to a semiconductor fabrication process, the multi-level capping layer formed on a substrate having a gate structure formed thereon, wherein the gate structure further comprising a conductive layer, a gate oxide layer on which forms the conductive layer, and a spacer formed on a sidewall of the conductive layer and the gate oxide layer, wherein the multi-level capping layer comprises:

a metal layer formed on the substrate for covering the gate structure;

a barrier layer formed on the metal layer; and a stuffing layer formed on the barrier layer, so that the staffing layer is isolated from the metal layer by the barrier layer;

wherein the metal layer, the barrier layer, and the stuffing layer are conformal to a profile of the gate structure and forms the multi-film capping layer.

8. The multi-level capping layer of claim 7, further comprising shallow trench isolation structures formed within the substrate.

9. The multi-level capping layer of claim 7, wherein the conductive layer is a doped polysilicon layer.

10. The multi-level capping layer of claim 7, wherein the metal layer includes a cobalt layer.

11. The multi-level capping layer of claim 7, wherein the barrier layer includes a titanium nitride layer.

12. The multi-level capping layer of claim 7, wherein the stuffing layer includes a titanium layer.

13. The multi-level capping layer of claim 12, wherein the stuffing layer has a thickness of about 50–300 angstroms.

14. The multi-level capping layer of claim 7, wherein the stuffing layer includes a silicon nitride layer.

15. The multi-level capping layer of claim 14, wherein the stuffing layer has a thickness of about 50–100 angstroms.

16. A multi-level capping layer applicable to a semiconductor fabrication process, multi-level capping layer formed on a substrate having a gate structure formed thereon, wherein the gate structure further comprising a conductive layer, a gate oxide layer on which forms the conductive layer, and a spacer formed on a sidewall of the conductive layer and the gate oxide layer, wherein the multi-level capping layer comprises:

a metal layer formed on the substrate for covering the gate structure;

a barrier layer formed on the metal layer; and a stuffing layer formed on the barrier layer, so that the stuffing layer is isolated from the metal layer by the barrier layer, wherein stuffing layer is made of dense material less permeable to oxygen or moisture to protect the barrier layer from reaction with the oxygen or moisture, wherein the metal layer, the barrier layer, and the stuffing layer are conformal to a profile of the gate structure and forms the multi-film capping layer.

\* \* \* \* \*